United States Patent
Masuda

[19]

[11] Patent Number: 5,867,370

[45] Date of Patent: Feb. 2, 1999

[54] PLASTIC SHIELD ENCLOSURE AND METHOD OF PRODUCING THE SAME

[75] Inventor: Hitoshi Masuda, Saitama, Japan

[73] Assignee: NEC Corporation, Tokyo, Japan

[21] Appl. No.: 555,399

[22] Filed: Nov. 9, 1995

[30] Foreign Application Priority Data

Nov. 24, 1994 [JP] Japan .................................. 6-289525

[51] Int. Cl.[6] ............................................ H05K 7/14
[52] U.S. Cl. ........................ 361/800; 361/814; 361/816; 361/818; 174/35 R
[58] Field of Search ................................. 361/212, 220, 361/752, 753, 757, 799, 800, 814, 816, 818; 439/607, 609; 174/35 R, 35 GC; 455/90, 91, 351, 346, 348, 128, 352, 300; 379/433, 428

[56] References Cited

U.S. PATENT DOCUMENTS 5,045,971  9/1991  Ono et al. .
5,086,509  2/1992  Inubushi et al. .......................... 455/89
5,150,282  9/1992  Tomura et al. .
5,596,487  1/1997  Castaneda et al. ..................... 361/814

FOREIGN PATENT DOCUMENTS

0078934A2  5/1983  European Pat. Off. .
0180383A2  5/1986  European Pat. Off. .
3-20492    1/1991  Japan .

Primary Examiner—Leo P. Picard
Assistant Examiner—Phuong T. Vu
Attorney, Agent, or Firm—Whitham, Curtis & Whitham

[57] ABSTRACT

A conductive first enclosure section 11 is molded through a primary molding process. At this time, a primary mold is provided so as to form openings 13 and 14 in the first enclosure section 11 for portions that needs insulation (non-conductivity). At a secondary molding process to make a non-conductive second enclosure section 12, a secondary mold is provided so as to cover the first enclosure section 11 and then non-conductive resin is filled thereinto. The openings 13 and 14 in the first enclosure section 11 are filled with the non-conductive resin, thus the rear cover 1 is formed.

12 Claims, 6 Drawing Sheets

PLASTIC SHIELD ENCLOSURE AND METHOD OF PRODUCING THE SAME

BACKGROUND OF THE INVENTION

The present invention relates to an art of a plastic shield enclosure and, more particularly, to an art of a plastic enclosure having an EMI (Electromagnetic interference) shielding function for a personal hand-held-portable phone.

Generally a plastic enclosure section of an electronic equipment has its inner surface applied with a metal film in order to keep a circuit thereof from unnecessary electric wave leakage and electric wave interference. Such a metal film is prepared by using surface treatment techniques including plating, coating, deposition and flame coating.

However, a compact and high density mounted electronic equipment, such as a personal hand-held-portable phone a may have parts which are in danger of causing short-circuit due to small clearances between components of the circuit and the metal film. Such parts are protected through masking treatment or an insulating film application. In case the electronic equipment includes a built-in antenna, the metal film applied in a certain range of the built-in antenna should be removed so as to prevent adverse effects to antenna characteristics.

An example of such an art is disclosed in Japanese Utility Model Application Laid-Open No. 20492 (1991). FIG. 14 shows a cross-sectional view of a plastic enclosure using this prior art.

In the prior art, a first enclosure section 61 formed of an ABS resin covering an electronic component 60 and a second enclosure section 62 formed of a resin covering the first enclosure section 61 are molded in a body through two-color molding. Here, only a surface of the first enclosure section 61 is processed by a metal plating 63.

The above-mentioned prior art effects reduction of the number of components and the thickness of the whole enclosure body.

In the above-mentioned prior art, however, performing surface treatment for the metal film application costs very much. Additionally, masking treatment and the insulating film application are necessary to protect the parts which are in danger of causing short-circuit to the circuit. If the equipment has a built-in antenna, the metal film which has been applied has to be removed so as to prevent adverse effects on the antenna characteristics, thus further adding to the production cost.

There is another type of conventional shield enclosure formed of a conductive resin of a plastic material in which carbon powder or metal powder is dispersed.

In this prior art using the plastic material dispersed with a carbon powder or a metal powder, a decorative coating should be included for improving an appearance thereof, thus adding to the coating cost. If the equipment mounts a built-in antenna, the insulating process becomes troublesome.

SUMMARY OF THE INVENTION

It is an object of the present invention to solve the above-mentioned problems.

It is another object of the present invention to provide a plastic shield enclosure produced at a low cost by eliminating processes for metal film application and partial insulation as well as decorative coating for improving appearance.

It is still another object of the present invention to provide a production method of a plastic shield enclosure produced at a low cost by eliminating processes for metal film application and partial insulation as well as decorative coating for improving appearance.

The object of the present invention is achieved by a plastic shield enclosure having a first enclosure section made of a conductive resin having an opening section; and a second enclosure section made of a non-conductive resin covering the first enclosure section.

Moreover, the object of the present invention is achieved by a method for producing a plastic shield enclosure comprising steps of; assembling a core and a first cavity to form an opening corresponding to an opening section of a first enclosure section; filling a conductive resin into a space formed by assembling the core and the first cavity; removing the first cavity after filling the conductive resin; assembling a second cavity to form a second enclosure section made of non-conductive resin on a surface of the conductive resin after removing the first cavity; and filling a non-conductive resin into a space formed by assembling the second cavity.

In the present invention, the first enclosure section is first formed by using a conductive resin. Next, the second enclosure section is formed so as to cover the first enclosure section by using a non-conductive resin. At this time, an opening is provided in a part of the first enclosure section corresponding to a part that must be non-conductive through two-color molding, thus a plastic shield that partially has a non-conductive part is obtained.

The present invention provides a plastic shield enclosure which requires no conventional processes for metal film application and insulation and presents excellent appearance quality at a substantially low cost with improved mass productivity. In addition, the present invention enables an improved excellent EMI shielding function by forming the first enclosure section so as to cover electronic components that need EMI shielding.

BRIEF DESCRIPTION OF THE DRAWINGS

This and other objects, features and advantages of the present invention will become more apparent upon a reading of the following detailed description and drawings, in which.

DESCRIPTION OF THE PREFERRED EMBODIMENTS

Referring to drawings, the first embodiment of the present invention is explained.

Figure 1:
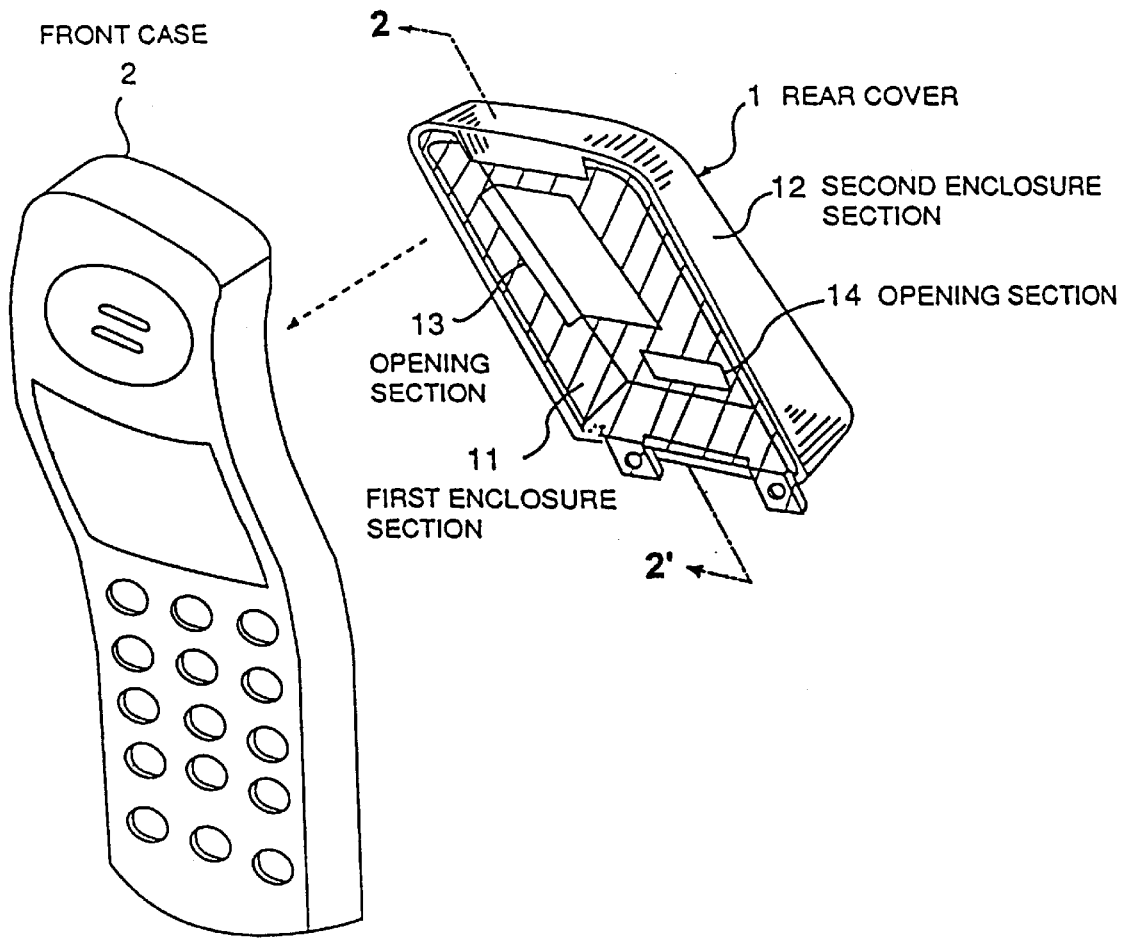
FIG. 1 is a perspective view of a first embodiment of the present invention.
Figure 2:
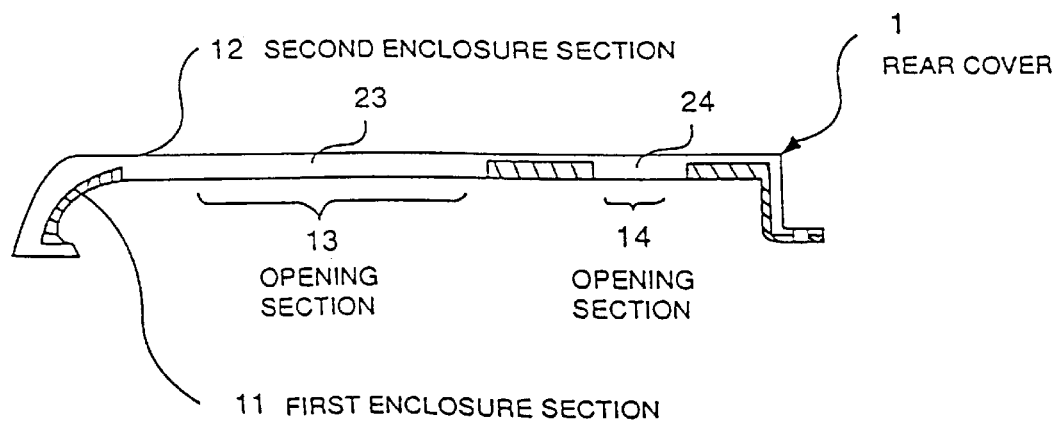
FIG. 2 is a cross-sectional view taken on line 2-2' of FIG. 1.

FIG. 1 is a perspective view of an example of the present invention in the form of a rear cover of a personal hand-held-portable phone. FIG. 2 is a cross-sectional view taken on line 2-2' of FIG. 1.

Referring to FIG. 1, a front case 2 of a personal hand-held-portable phone mounts a high frequency circuit requiring EMI shielding at its top. The top part of the front case 2 is covered with a rear cover 1 having an EMI shielding capability.

The front case 2 mounts a battery case at a lower part thereof. A certain type of the circuit requires the front case having the shielding capability. In this case, the front case is constructed in the same manner as in the rear cover 1 described below.

A rear cover 1 comprises a first enclosure section 11 (a part shown by oblique lines) forming an inner surface of the rear cover 1 and a second enclosure section 12 forming an outer surface of the rear cover 1.

The first enclosure section 11 is made of a conductive resin. For the conductive resin, for example, a resin such as ABS resin, such as, for example, acrylonitrile-butadiene-styrene, to name but one, polycarbonate resin, polystyrene resin or the like in which a carbon powder or a powder of a metal such as stainless or aluminum is dispersed is used. The first enclosure section 11 features opening sections 13 and 14 corresponding to the parts needed to prevent a short-circuit with components of the circuit or giving effects to a built-in antenna characteristics, that is, parts that needs insulation (non-conductivity).

The second enclosure section 12 is made of a non-conductive resin. As the conductive resin, a resin such as ABS resin, polycarbonate resin, polystyrene resin or the like is used. The second enclosure section 12 features that a side thereof fitting to the first enclosure section 11 has protrusion sections 23 and 24. The opening section 13 receives the protrusion section 23 and the opening section 14 receives the protrusion section 24. A part of the inner surface of the rear cover 1 that needs insulation is made of non-conductive resin.

The first enclosure section 11 and the second enclosure section 12 are not formed separately but molded in a body through two-color molding as described later on.

Next, a production method of a rear cover 1 is explained. FIGS. 3 to 6 are typical views for explaining a production method of a rear cover 1.

In a conventional method, a plastic component such as the rear cover 1 and the like is produced through steps of making a mold consisting of a cavity (a female form) for an outer surface of the component and a core (a male form) for an inner surface, filling a resin into a space made by the core and the cavity and hardening the resin.

Different from the conventional production method, the present invention adopts two-color molding for the rear cover 1. Here, the two-color molding refers to a molding process where a primary molding process and a secondary molding process are conducted in one cycle, using a molding machine enabling to attach two kinds of cavities.

First a core 31 to form an inner surface of the rear cover 1 is prepared. Next, a first cavity 32 having protrusion sections corresponding to a part to prevent short-circuit with components of the circuit and a non-conductive part so as to prevent effects to a built-in antenna characteristics. These protrusion sections fit to the surface of the cavity 31 so that there is not any space. Then, the core 31 and the first cavity 32 are assembled.

Figure 3:
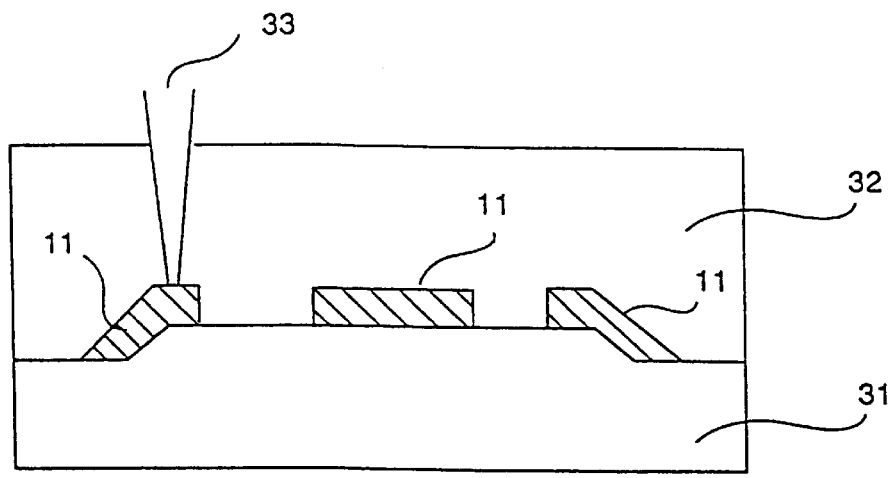
FIG. 3 is a typical view for explaining a production method of a rear cover 1.

In the next step, a conductive ABS resin in which stainless fibers are dispersed is filled into a space made by the core 31 and the first cavity 32 from a fill opening 33 to form a primary component (the first enclosure section 11). In FIG. 3, oblique line section shows the primary component (the first enclosure section 11) formed by the conductive resin.

Figure 4:
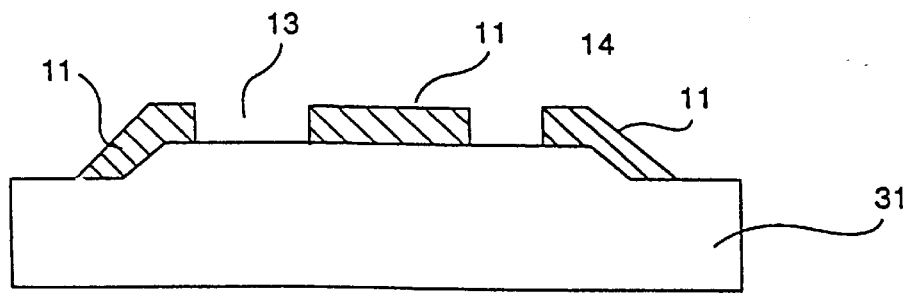
FIG. 4 is another typical view for explaining the production method of a rear cover 1.

Then, as shown in FIG. 4, only the first cavity 32 is removed from the primary component as it sticks to the core 31. In this step, the opening sections 13 and 14 are provided in the primary component (the first enclosure section 11).

Figure 5:
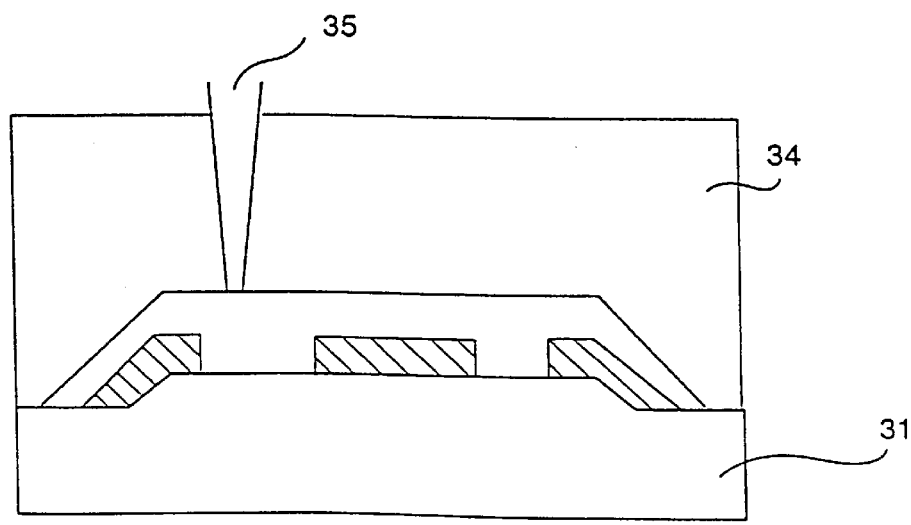
FIG. 5 is still another typical view for explaining the production method of a rear cover 1.

Continuously, as shown in FIG. 5, the second cavity 34 for forming the outer surface of the rear cover 1 and the core 31 sticked with the primary component are assembled. Then, the space made by the cavity 34 and the core 31 is filled with an ABS resin from the fill opening 35. The ABS resin is filled into the opening sections 13 and 14 as well as surface portion of the rear cover 1, thus a secondary component (the second enclosure section 12) is formed.

Finally, the primary component (the first enclosure section 11) and the secondary component (the second enclosure section 12) are hardened and molded, thus the rear cover 1 is made in a body.

Figure 6:
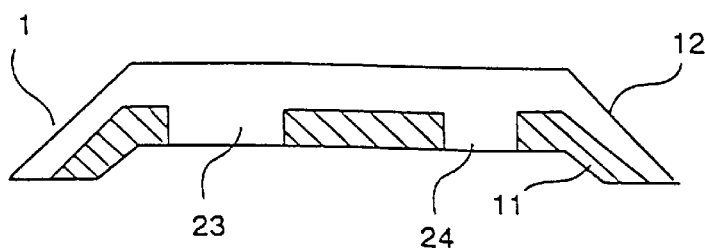
FIG. 6 is a further typical view for explaining the production method of a rear cover 1.

FIG. 6 shows the rear cover 1 molded in a body after removing the second cavity 34 and the core 31. As shown in FIG. 6, the conductive resin forms the part corresponding to a high frequency circuit section that needs EMI shielding function, and the non-conductive resin forms the part corresponding to a part that needs to prevent short-circuit with circuit components.

In this production method, an ABS resin is used for the non-conductive resin and an ABS resin in which stainless fibers are dispersed is used for the conductive resin. However, it is possible to use other kinds of resins, for example, polycarbonate resin, polystyrene resin or the like for the non-conductive resin, and the above-mentioned resin described as a non-conductive resin in which a carbon powder or a metal powder of stainless, aluminum or the like is dispersed for the conductive resin.

In addition, it is easy to change the pattern of the conductive section and the non-conductive section by changing the shape of the first cavity 32 and the second cavity 34.

Next, the second embodiment is explained.

In the second embodiment, the first enclosure section (made of a conductive resin) covers a high frequency circuit that needs EMI shielding function.

Figure 7:
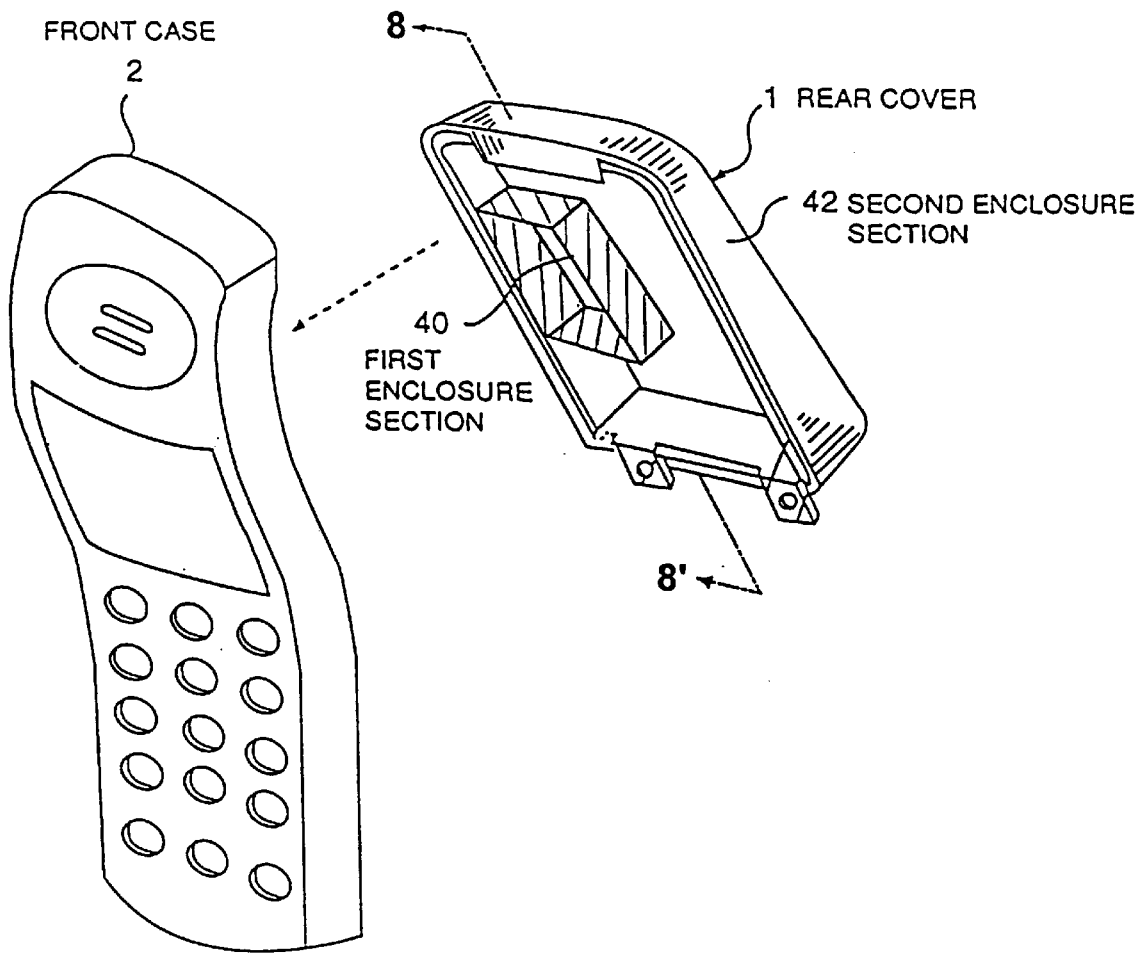
FIG. 7 is a perspective view of a second embodiment of the present invention.
Figure 8:
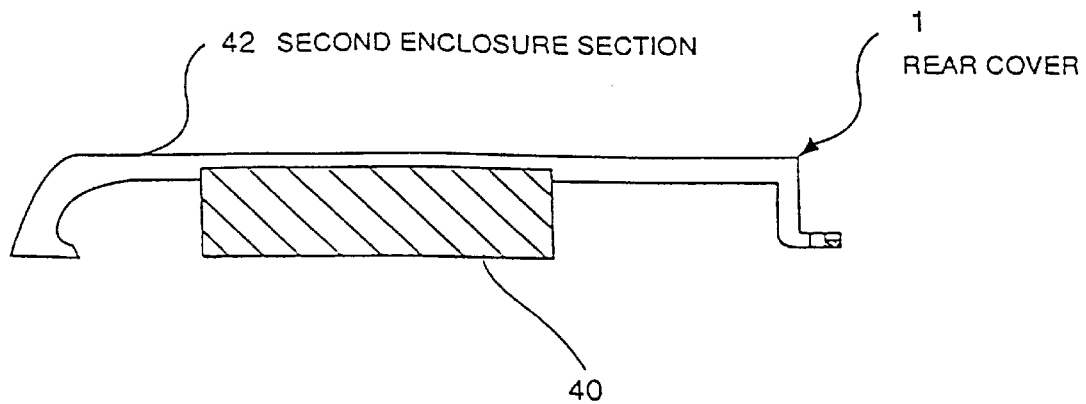
FIG. 8 is a cross-sectional view taken on line 8-8' of FIG. 7.

FIG. 7 is a perspective view of a second embodiment of the embodiment and it shows a case of applying the second embodiment for the rear cover 1 of a hand-held-portable phone. FIG. 8 is a cross-sectional view taken on line 8-8' of FIG. 7. Here, the same portions as those in the first embodiment are referred to by the same label numbers as in the first embodiment.

Figure 9:
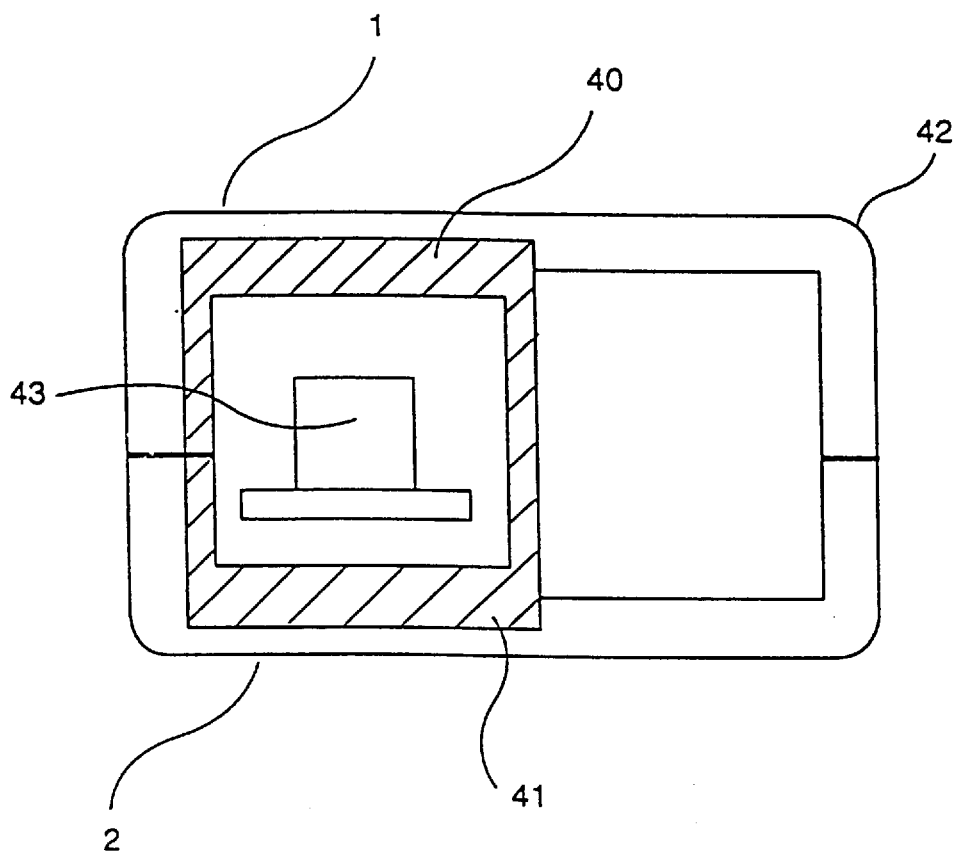
FIG. 9 is a cross-sectional view of a front case 2 and the rear cover 1 that are assembled.

The numeral 40 is the first enclosure section made of a conductive resin. An enclosure section 41 made of a conductive resin is formed in the side of a front case 2. The first enclosure section 40 and the enclosure section 41 are components to cover a high frequency circuit that needs EMI shielding function. A cross-section view of the front case 2 and the rear cover 1 that are set in predetermined position is shown by FIG. 9. As shown in FIG. 9, the enclosure section 40 and the enclosure 41 in combination cover the whole of the high frequency circuit 43.

Next, a production method of the rear cover 1 of the second embodiment.

Similar to the first embodiment, the rear cover 1 of the second embodiment is also formed through two-color molding. Here, FIGS. 10 to 13 are typical views for explaining the production method of the rear cover 1.

First, a core 51 for forming an inner surface of the rear cover 1 is prepared. A groove for forming the enclosure section 40 of a conductive resin is provided on the core 51. Next, a first cavity 52 for forming the enclosure section 40 of a conductive resin is prepared. Then, the core 51 and the first cavity 52 are assembled.

Figure 10:
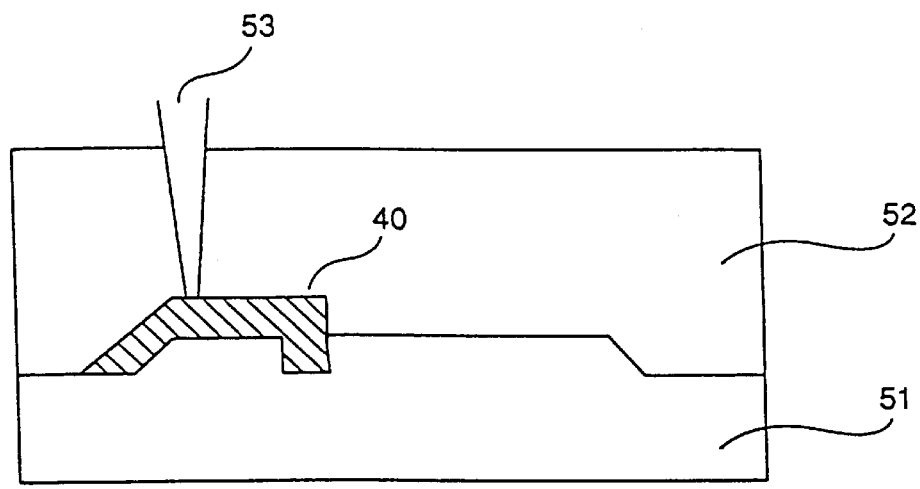
FIG. 10 is a typical view for explaining a production method of a rear cover 1.

Here, through filling a conductive ABS resin in which stainless fibers are dispersed into a space made by the core 51 and the first cavity 52 from the fill opening 53, a primary component (the first enclosure section 40) is formed. In FIG. 10, the oblique line section shows the primary component (the first enclosure section 40) made of the conductive resin.

Figure 11:
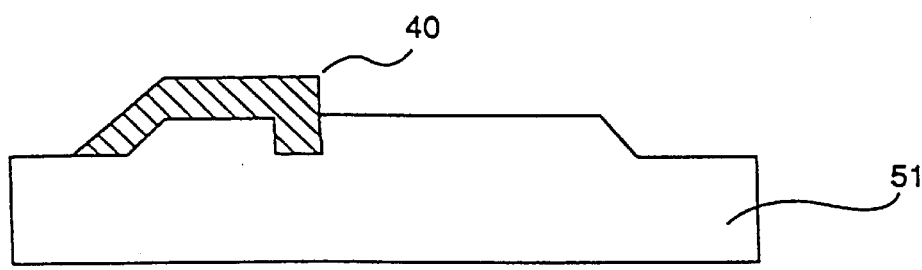
FIG. 11 is another typical view for explaining the production method of a rear cover 1.
Figure 12:
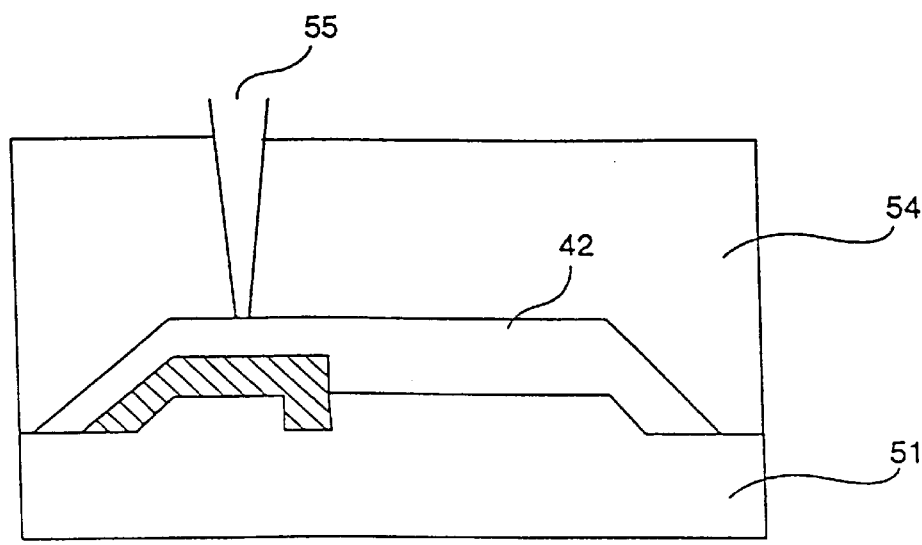
FIG. 12 is still another typical view for explaining the production method of a rear cover 1.

Then, as shown in FIG. 11, only the first core 52 is removed from the primary component as it sticks to the core 51. In this step, the primary component (the first enclosure section 40) is in a shape of enclosure.

Continuously, the second cavity 54 for forming the outer surface of the rear cover 1 and the core 51 sticked with the primary component are assembled. Then, the space made by the cavity and the core is filled with an ABS resin from the fill opening 55, thus a secondary component (the second enclosure section 42) is formed.

Finally, the primary component (the first enclosure section 40) and the secondary component (the second enclosure section 42) are hardened and molded, thus the rear cover 1 is made in a body.

Figure 13:
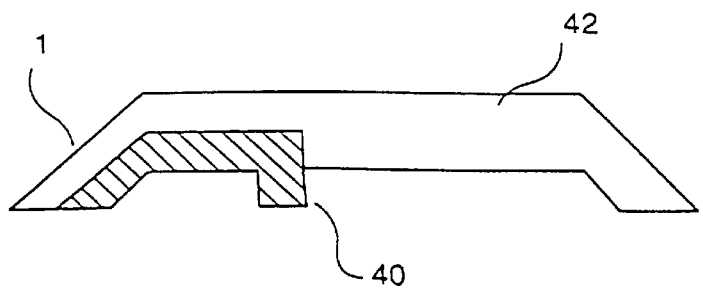
FIG. 13 is a further typical view for explaining the production method of a rear cover 1.
Figure 14:
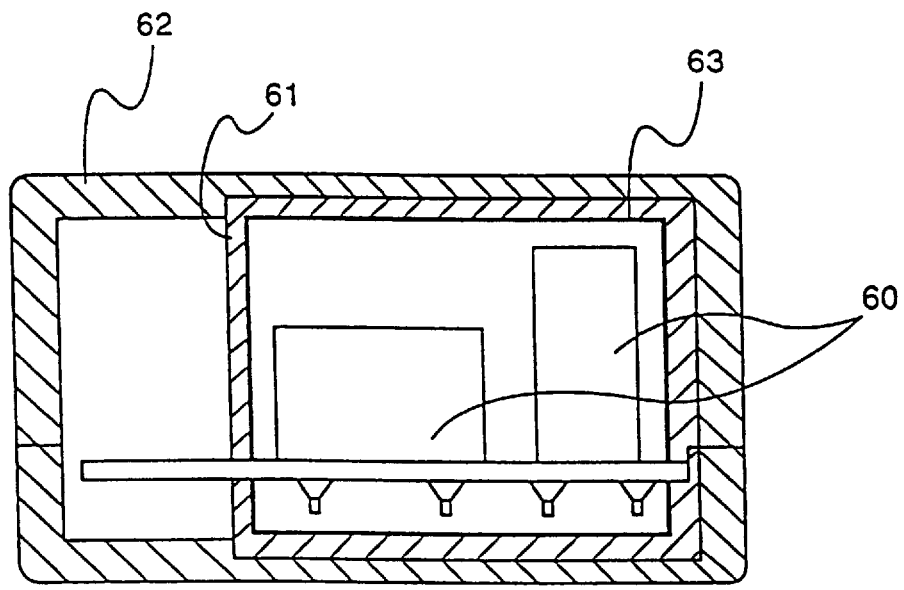
FIG. 14 is a drawing for explaining a prior art.

FIG. 13 shows the rear cover 1 molded in a body after removing the second cavity 54 and the core 51. As shown in FIG. 13, the conductive resin forms the part corresponding to a high frequency circuit section that needs EMI shielding function.

In this production method, an ABS resin is used for the non-conductive resin and an ABS resin in which stainless fibers are dispersed is used for the conductive resin. However, it is possible to use other kinds of resins, for example, polycarbonate resin, polystyrene resin or the like for the non-conductive resin, and the above-mentioned resin described as a non-conductive resin in which a carbon powder or a metal powder of stainless, aluminum or the like is dispersed for the conductive resin.

In addition, it is easy to produce an enclosure in combination with that made by the first embodiment through changing the shape of the first cavity 52 and the second cavity 54.

What is claimed is:

1. A plastic shield enclosure, comprising:
   a first enclosure section made of a conductive resin having an opening section, said first enclosure section forming an electromagnetic shield; and
   a second enclosure section made of a non-conductive resin covering said first enclosure section, wherein said opening section of said first enclosure section is filled by said resin forming said second enclosure section to allow electromagnetic energy to pass through said opening section, wherein said first enclosure section and said second enclosure section are molded in an integral body.

2. The plastic shield enclosure of claim 1, wherein said first enclosure section and said second enclosure section are molded in an integral body through two-color molding.

3. The plastic shield enclosure of claim 1, wherein said conductive resin of said first enclosure section comprises a resin in which a conductive material is dispersed.

4. The plastic shield enclosure of claim 1, wherein said conductive resin of said first enclosure section comprises a resin mixed with one of a carbon and a metal.

5. The plastic shield enclosure of claim 1, wherein said non-conductive resin of said enclosure section comprises at least one resin selected from a group consisting of ABS resin, polycarbonate resin and polystyrene resin.

6. A plastic shield enclosure for enclosure for encasing an electrical device, comprising:
   a first enclosure section made of a conductive resin for blocking electromagnetic emissions from the electrical device; and
   a second enclosure section made of a non-conductive resin covering said first enclosure section, wherein said first enclosure section and said second enclosure section are molded in a body through two-color molding, said second enclosure comprising said non-conductive resin being positioned to correspond to portions of the electrical device susceptible to electrical shorts by said conductive resin.

7. The plastic shield enclosure of claim 6, wherein said conductive resin of said first enclosure section comprises a resin in which a conductive material is dispersed.

8. The plastic shield enclosure of claim 6, wherein said conductive resin of said first enclosure section comprises a resin mixed with one of carbon and a metal.

9. A plastic shield enclosure with EMI (Electromagnetic Interference) shielding function used for a hand-held-portable phone, comprising:
   a first enclosure section made of a conductive resin having an opening section, said first enclosure section forming an electromagnetic shield; and
   a second enclosure section made of a non-conductive resin having a protrusion section filling said opening section of said first enclosure section and covering said first enclosure section to allow electromagnetic energy to pass through said opening section wherein said first enclosure section and said second enclosure section are molded in an integral body.

10. The plastic shield enclosure of claim 9, wherein said first enclosure section and said second enclosure section are molded in an integral body through two-color molding.

11. The plastic shield enclosure of claim 9, wherein said conductive resin of said first enclosure section comprises a resin in which a conductive material is dispersed.

12. The plastic shield enclosure of claim 9, wherein said conductive resin of said first enclosure section comprises a resin mixed with one of carbon and a metal.

* * * * *